US006217361B1

(12) United States Patent
Murr

(10) Patent No.: US 6,217,361 B1
(45) Date of Patent: Apr. 17, 2001

(54) ZIP SOCKET HAVING MOVABLE FRAME

(75) Inventor: Keith McQuilkin Murr, Etters, PA (US)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/259,385

(22) Filed: Feb. 26, 1999

(51) Int. Cl.⁷ .............................. H01R 4/50; H01R 13/625
(52) U.S. Cl. .......................................... 439/342; 439/526
(58) Field of Search .................................. 439/342, 525, 439/526, 70, 259

(56) References Cited

U.S. PATENT DOCUMENTS

| | | |
|---|---|---|
| 4,080,032 | 3/1978 | Cherian et al. . |
| 4,245,877 | 1/1981 | Auriana . |
| 4,391,408 | 7/1983 | Hanlon et al. . |
| 4,402,563 * | 9/1983 | Sinclair ................................. 439/264 |
| 4,420,205 | 12/1983 | Kirkman . |
| 4,480,888 | 11/1984 | Hopkins et al. . |
| 4,531,792 | 7/1985 | Oshitani et al. . |
| 4,637,670 * | 1/1987 | Coller et al. ............................ 439/70 |
| 5,217,383 | 6/1993 | Hildebrandt et al. ................. 439/259 |
| 5,247,250 * | 9/1993 | Rios ........................................ 439/70 |
| 5,254,012 * | 10/1993 | Wang .................................... 439/342 |
| 5,562,474 * | 10/1996 | Lee ....................................... 439/342 |
| 5,569,045 * | 10/1996 | Hsu ....................................... 439/342 |
| 5,611,705 * | 3/1997 | Pfaff ..................................... 439/342 |
| 5,622,514 * | 4/1997 | Crompton, III et al. ............. 439/342 |
| 5,637,008 * | 6/1997 | Kozel ................................... 439/342 |
| 5,658,160 | 8/1997 | Lai ....................................... 439/342 |
| 5,730,615 * | 3/1998 | Lai et al. ............................. 439/342 |
| 5,829,988 * | 11/1998 | McMillan et al. ..................... 439/70 |
| 5,833,483 | 11/1998 | Lai et al. ............................. 439/342 |

OTHER PUBLICATIONS

Screwdriver Actuated ZIF (SAZ) PGA Sockets, Catalog 124263, Issued Dec. 1994, pp. 1–4.
AMP Customer Drawing No. 916639, Socket Assembly Screwdriver Actuated ZIF PGA., pp. 1–8, (no date).
AMP Customer Drawing No. C–916705, Socket Assembly, Low Profile, Screwdriver Actuated ZIF, PGA, pp. 1–7. (no date).

* cited by examiner

Primary Examiner—Brian Sircus
Assistant Examiner—Hae Moon Hyeon
(74) Attorney, Agent, or Firm—Bradley N. Ditty

(57) ABSTRACT

A ZIF socket is provided having a movable inner frame for protecting an electronic package received therein. The socket is comprised of a base having an outer frame and a separate movable inner frame disposed within the outer frame. The inner frame is movable between an open position, for receiving an electronic package, and a closed position, wherein the electronic package is locked in the socket. The inner frame is moved between the open and closed position by inserting a bladed tool into a tool receiving area and urging the blade against the inner frame.

19 Claims, 6 Drawing Sheets

ZIP SOCKET HAVING MOVABLE FRAME

FIELD OF THE INVENTION

The invention is directed toward a ZIF socket suitable for actuation by a tool and having a movable protective frame which carries the electronic package.

BACKGROUND OF THE INVENTION

Zero insertion force (ZIF) pin grid array (PGA) sockets are well known in the art. These sockets typically comprise a base holding a plurality of contacts in an array of cavities and a slidable cover disposed atop the base with a corresponding array of holes for alignment with the cavities. A ZIF PGA socket has an open and closed position wherein an electronic package is received in the socket when in the open position and shifted into electrical contact with the array of contacts when in the closed position.

ZIF PGA sockets implement a variety of actuation means to open and close the socket. U.S. Pat. No. 5,052,101 discloses a socket for use with a specially designed tool which slides a cover open and closed. U.S. Pat. No. 5,256,080 discloses a ZIF PGA socket which is opened and closed by actuating a rectangular bail. And, U.S. Pat. No. 5,697,803 shows a ZIF PGA socket actuated with a single lever arm. Although effective, these types of actuation methods unfavorably influence the size, weight and complexity of the socket.

A popular solution to this drawback has been to utilize what is known as a screwdriver actuated ZIF (SAZ). An SAZ provides the familiar ZIF PGA socket structure with the addition of a tool receiving area on at least one side of the socket. The tool receiving area accommodates the head of a screwdriver or other similarly bladed tool. The screwdriver is inserted into the tool receiving area adjacent the electronic package and, by exerting force on the package with the screwdriver, the package and cover are urged from the open position to the closed position. Another recess may be provided on the opposite side of the socket in order to urge the electronic package from the closed position back to its original state.

A drawback of an SAZ socket is that, depending upon the material of which the electronic package is constructed, the package may be damaged by the blade of the screwdriver. Accordingly, it would be desirable to provide an SAZ socket which also protects the electronic package from potential damage caused by the tool.

Another drawback of current ZIF PGA socket designs is that the movable cover provides no relative location of the electronic package with respect to the socket. That is, an electronic package must be precisely placed within the holes of the cover and very little misalignment of the package within the socket is tolerated. Thus, in addition to providing protection to the electronic package, it would also be desirable to provide a socket having rough alignment of the electronic package to assist in the precise placement of the package within the holes of the movable cover.

SUMMARY OF THE INVENTION

A socket is disclosed for receiving an electronic package having an array of pins. The socket comprises a base having an array of cavities, each cavity having a pin receiving area and a pin contacting area. The base has a top side with an outer frame disposed thereon surrounding the array of cavities, wherein two opposing sides of the outer frame have notches for receiving a tool. Electrical contacts are mounted within the array of cavities and each electrical contact communicates between the top side of the base and a bottom of the base. The electrical contacts are suited for mounting to a printed circuit board. A movable tray is provided within the outer frame for holding the electronic package. The tray has upright edges about a perimeter of an array of holes. The tray further has a first position and a second position such that when the tray is in the first position, each hole is aligned with the pin receiving area of a respective cavity and when in the second position, each hole is aligned with the pin contacting area of the respective cavity.

A socket for receiving an electronic package having an array of pins is disclosed. The socket comprises a base having an array of cavities, wherein each cavity has a pin receiving region and a pin contacting region. The base has a top side with at least one upright wall disposed thereon adjacent the array of cavities and the at least one upright wall has a recess for receiving a tool on a side nearest the array of cavities. Electrical contacts are mounted within the array of cavities. A movable tray is mounted on the top side of the base for holding the electronic package, wherein the tray has an array of holes and at least one upright edge disposed adjacent the at least one upright wall. The movable tray also has a first position and a second position such that when the tray is in the first position each hole is aligned with a pin receiving region of a respective cavity and when in the second position each hole is aligned with the pin contacting region of the respective cavity.

BRIER DESCRIPTION OF THE DRAWINGS

Embodiments of the present invention will now be described with reference to the accompanying drawings, in which.

DETAILED DESCRIPTION OF THE INVENTION

Figure 1:
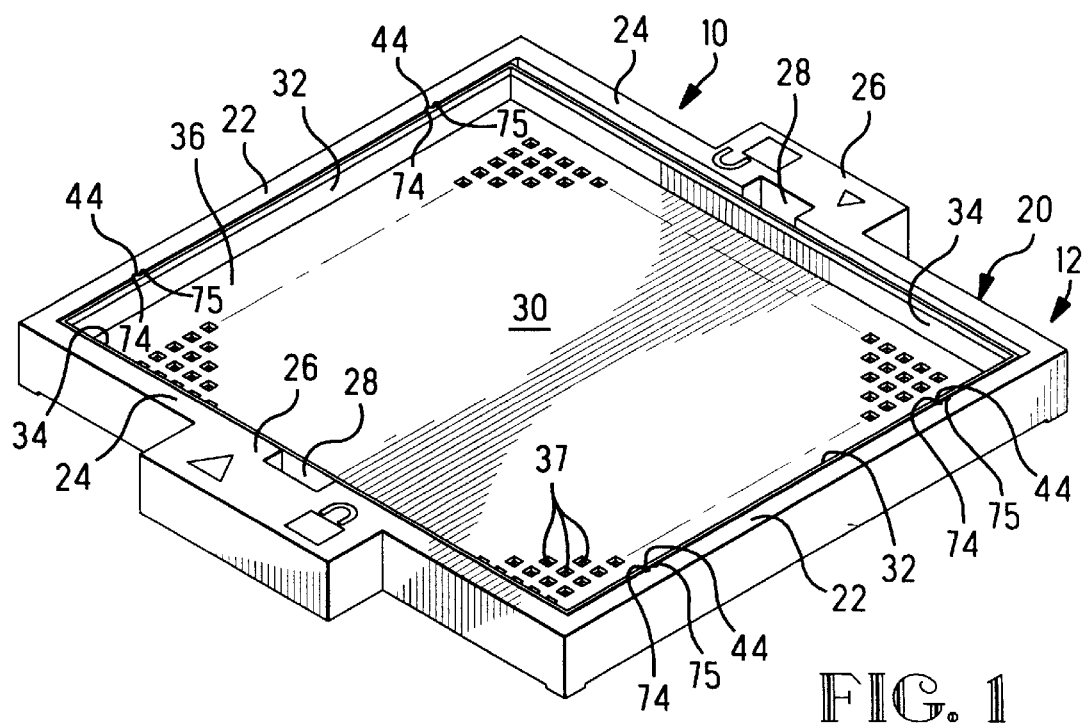
FIG. 1 is an isometric view of the ZIF socket of the present invention.

FIG. 1 is an isometric view of the ZIF socket 10 of the present invention. Socket 10 is comprised of a base 12 surrounded by outer frame 20. Outer frame 20 is formed by opposing sidewalls 22 which are joined by opposing end walls 24. Within outer frame 20 sits a movable inner frame 30 formed by opposing inner sidewalls 32 connected by opposing inner end walls 34. Spanning the interconnected inner sidewalls 32 and inner end walls 34 is floor 36 which is populated with an array of holes 37. Outer frame 20 is further provided with reinforced portions 26 disposed on either end wall 24. Tool receiving areas 28 are provided in reinforced portions 26 and take the form of a notch or cut out. The inner frame 30 is dimensioned so as to accommodate an electronic package 50, such as that shown in FIG. 2.

Figure 2:
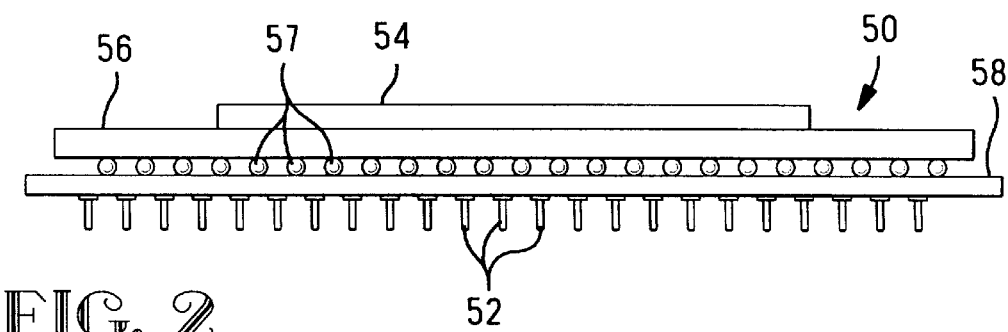
FIG. 2 is a side view of an electronic package suitable for mounting within the ZIF socket of the present invention.

FIG. 2 shows a side view of an electronic package 50 which could be used with the present invention. As shown, a die 54 is disposed on a substrate 56. The substrate 56 is connected to an interposer 58 which is constructed of a common printed circuit board material, such as FR-4. Eutectic solder balls 57 provide an electrical connection between the substrate 56 and the interposer 58. The package is completed by an array of pins 52 connected to interposer 58.

Interposer 58 is provided primarily to compensate for mismatches in the coefficient of thermal expansion of the die/substrate and the socket. In the same spirit, it may be desirable to provide a ZIF socket having an inner frame wherein floor 36 is constructed of a material having an advantageous coefficient of thermal expansion. For instance, floor member 36 could be constructed of a flexible film material in order to absorb CTE mismatches between the electronic package and the socket.

Figure 4:
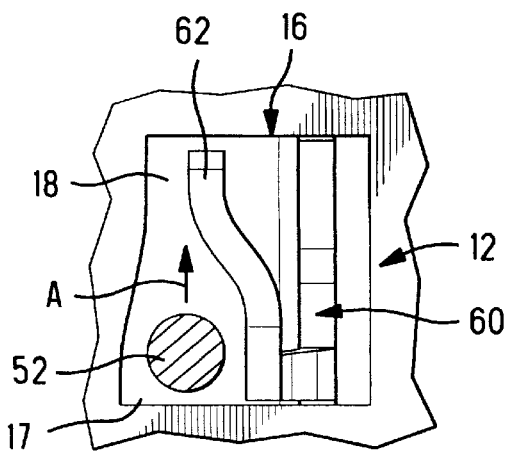
FIG. 4 is a top view of one of the contact cavities of FIG. 3.
Figure 5:
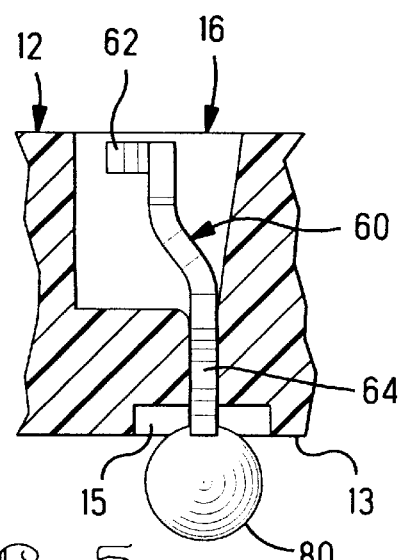
FIG. 5 is a cross-sectional side view of one of the contact cavities of FIG. 3.
Figure 3:
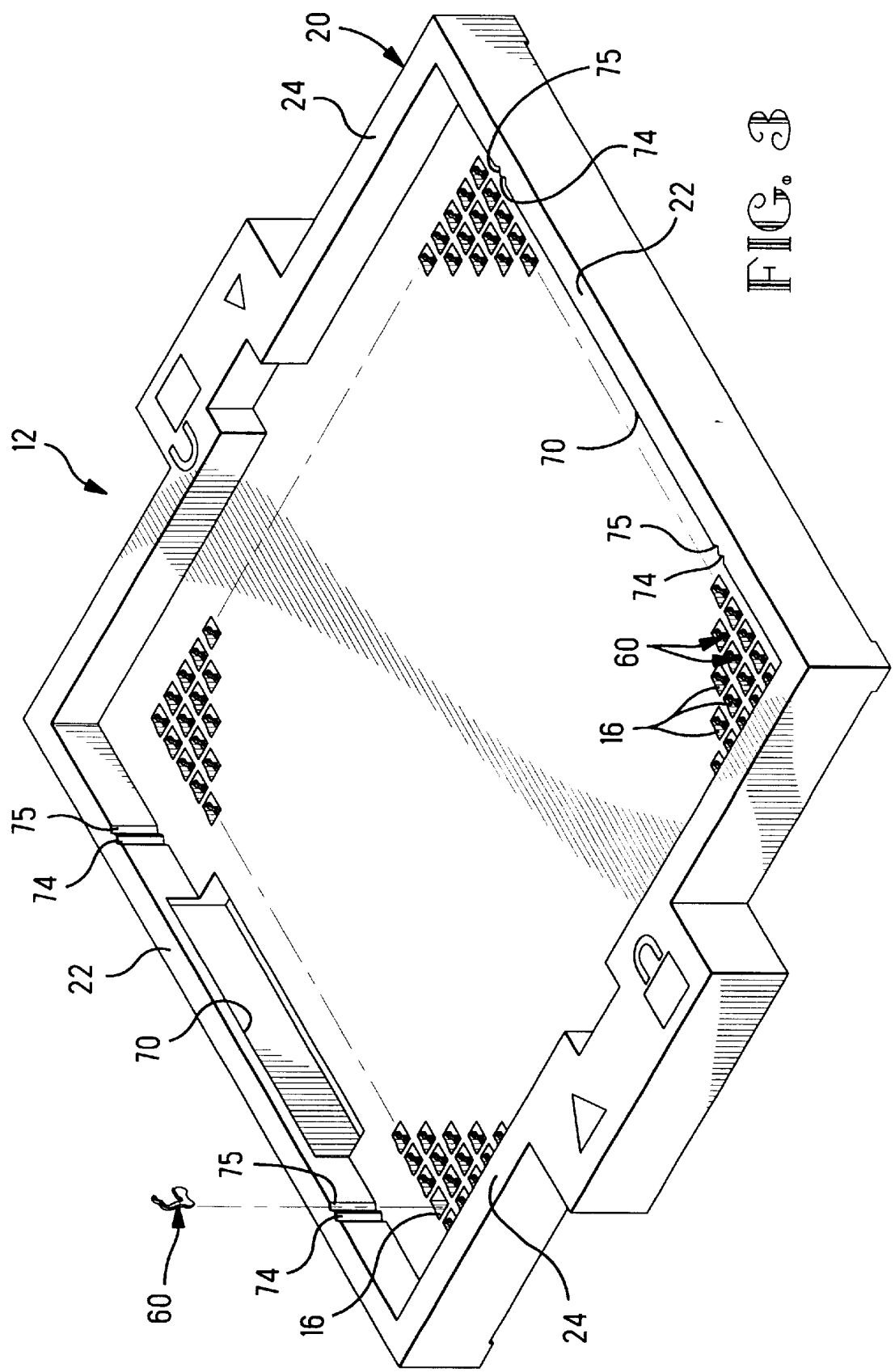
FIG. 3 is an isometric view of the base of the socket, wherein the base is shown partially populated with cavities and a contact is shown exploded from one of the cavities.
Figure 8:
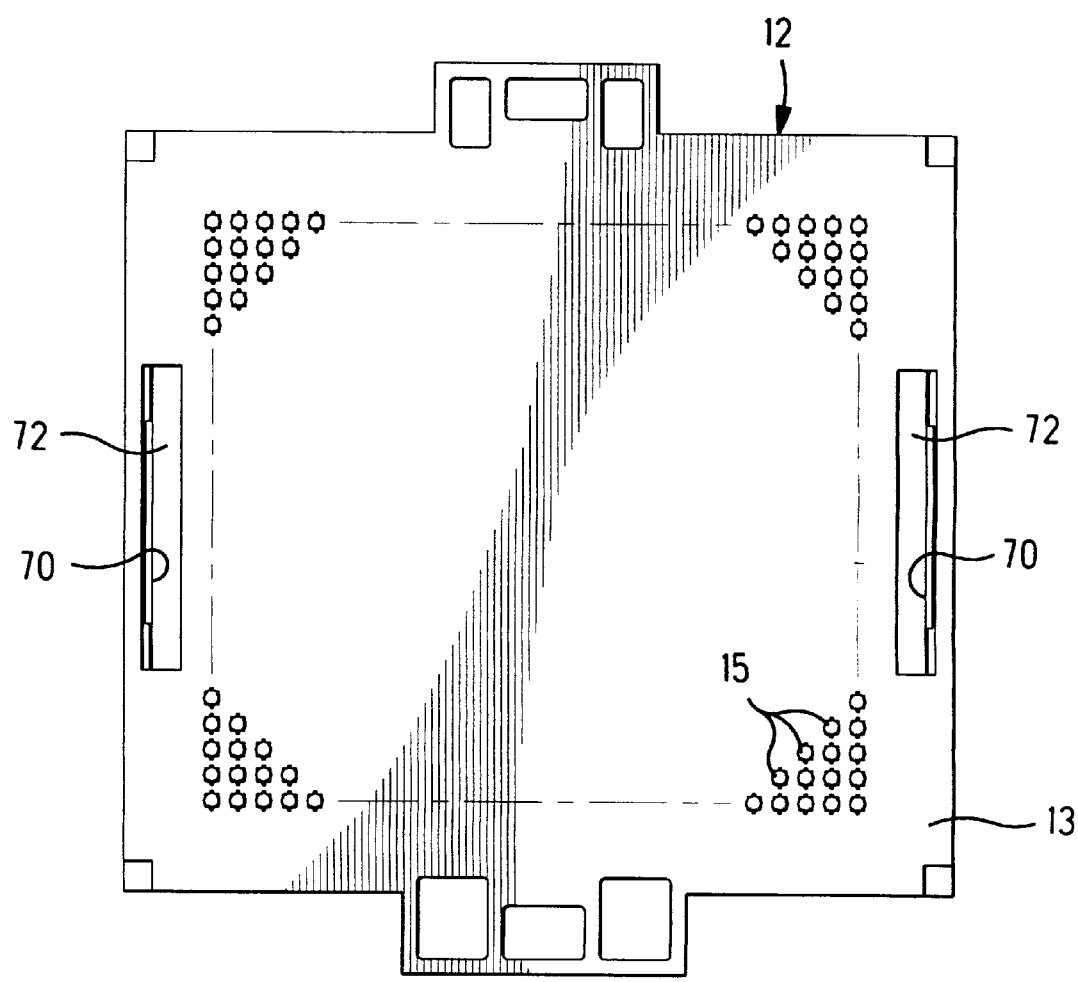
FIG. 8 is a bottom view of the base shown in FIG. 3.

Referring now to FIG. 3, an isometric view of base 12 is shown without inner frame 30. Base 12 has an array of cavities 16 populated with electrical contacts 60. Each cavity 16, shown in detail in FIG. 4, has a pin receiving area 17 and a pin contacting area 18 whereby a pin 52 from the electronic package 50 may be freely positioned in pin receiving area 17 and subsequently shifted in the direction of arrow A into electrical contact with a contact arm 62 of the contact 60 in pin contacting area 18. FIG. 5 shows electrical contact 60 having a tail portion 64 which passes through cavity 16 to a bottom side 13 of base 12. In the particular embodiment shown in FIG. 5, a pocket 15 is formed in bottom side 13 of base 12 for each cavity 16. These pockets 15 are also shown in FIG. 8 and are provided to facilitate electrical connection between a printed circuit board (not shown) and the electrical contact 60. Electrical connection could be performed by reflowing solder balls 80 within pockets 15 to connect tail portion 64 to conductive regions on a printed circuit board. Alternatively, tail portions 64 could be lengthened to extend through pockets 15 and beyond bottom side 13 to provide through hole connection with a printed circuit board.

Referring back to FIG. 1, socket 10 is shown with inner frame 30 positioned in an open, or unlocked, position wherein holes 37 are aligned only with pin reception areas 17 of each cavity 16. This alignment in the open position allows an electronic package 50 (shown in FIG. 2) to be seated within inner frame 30. In doing so, pins 52 are received through holes 37 and accepted in the pin reception areas 17 of each cavity 16, as illustrated in FIG. 4. When in the open position, pins 52 are prevented from entering pin contacting area 18 of cavity 16. The isolation of pins 52 in pin receiving area 17 when inserting the electronic package 50 into socket 10, not only properly seats the electronic package in the socket, but also prevents contact arms 64 of electrical contact 60 from being damaged by the pins 52 of electronic package 50.

Figure 6:
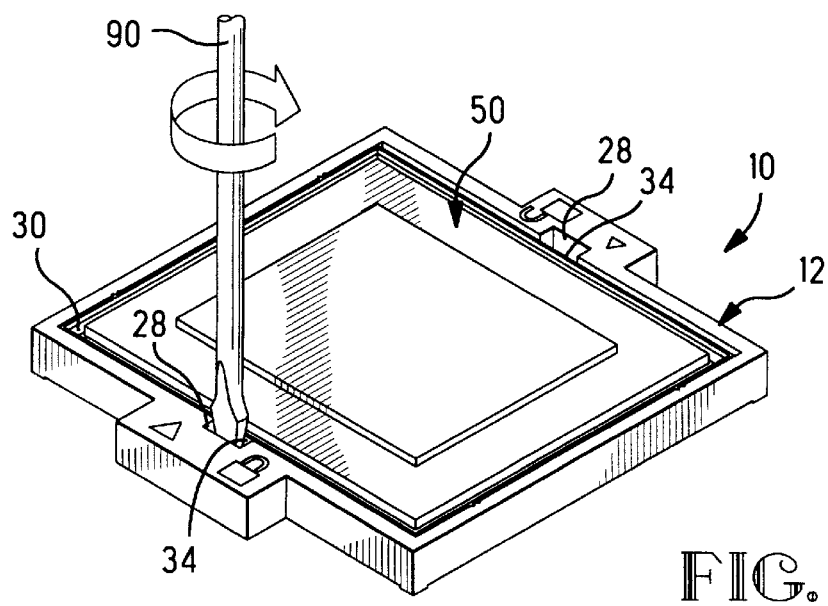
FIG. 6 is an isometric view of the ZIF socket of the present invention loaded with the electronic package of FIG. 2.

Upon seating the electronic package 50 in socket 10, as shown in FIG. 6, a screwdriver 90, or other bladed object, may be inserted into tool receiving area 28 and urged against the outside of inner end wall 34 of inner frame 30 to shift the frame and electronic package into a closed, or locked, position. In this closed position, pins 52 will have become shifted into electrical contact with contact arm 62 located in pin contacting area 18.

Figure 7:
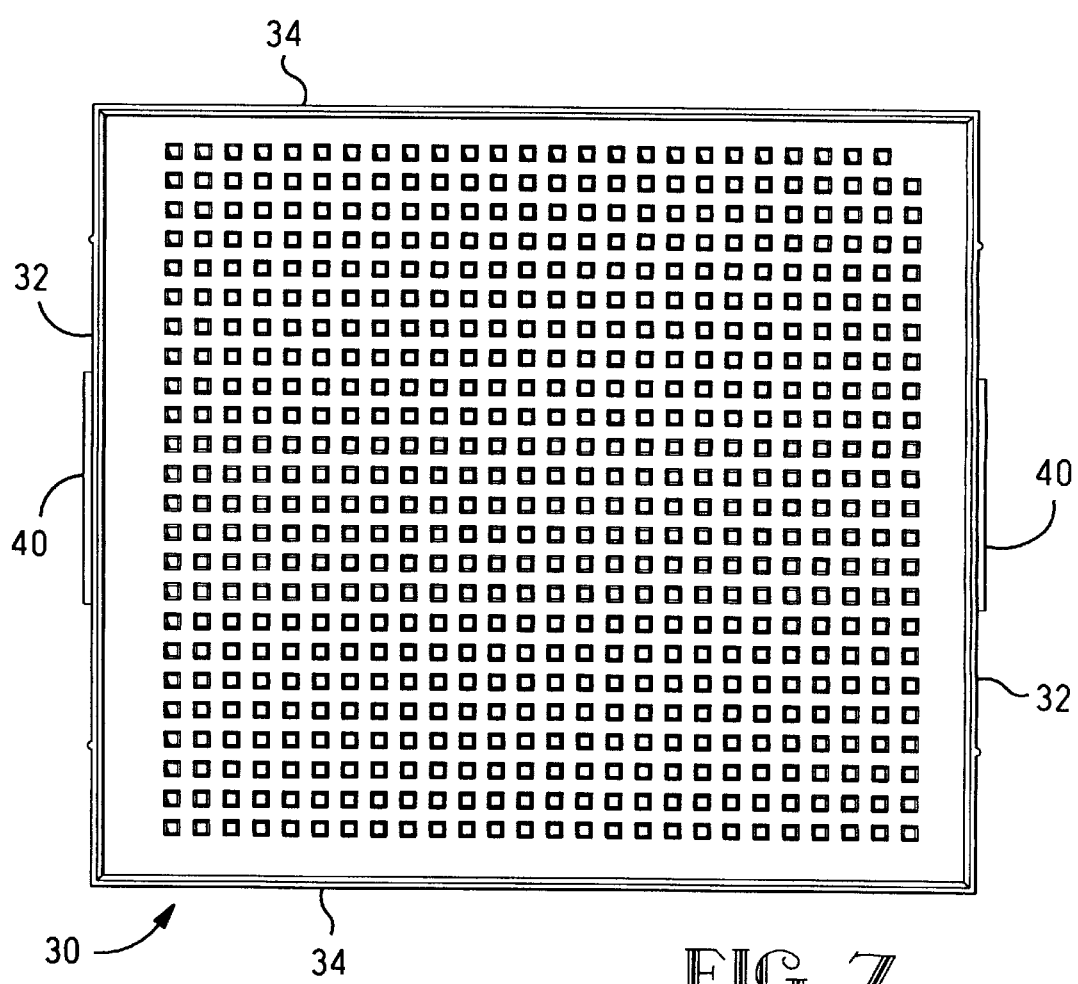
FIG. 7 is a top view of the inner frame shown in FIG. 1.
Figure 9:
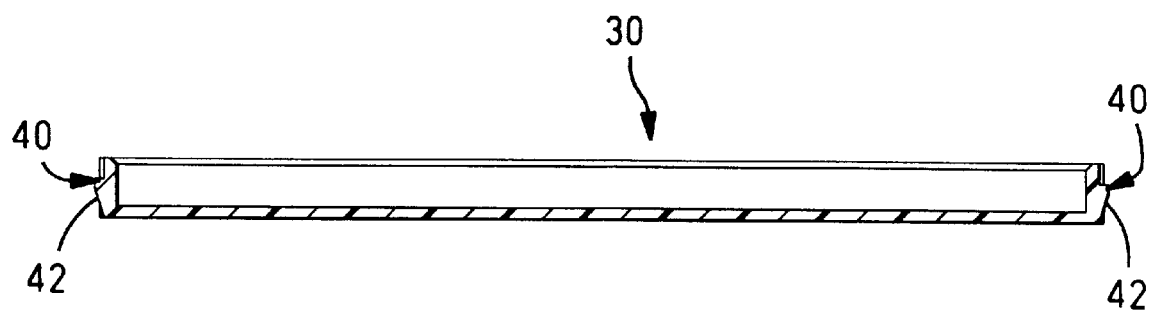
FIG. 9 is a cross-sectional side view of the inner frame of FIG. 7.

In order to facilitate the required sliding motion of inner frame 30, rails 40 are disposed on the outer surface of inner sidewalls 32 as shown in FIG. 7. Referring back to FIG. 3, shoulders 70 are formed on the inner surface of sidewalls 22 to provide a ledge under which rails 40 may ride when inner frame 30 is moved from the open to closed position and vice versa. As best shown in FIG. 8, elongated cut outs 72 are provided to facilitate simple and efficient molding of shoulder 70. FIG. 9 shows that rails 40 may be provided with tapered lead-in surfaces 42 to assist in assembly so that inner frame 30 need merely be snapped into base 12.

Figure 10:
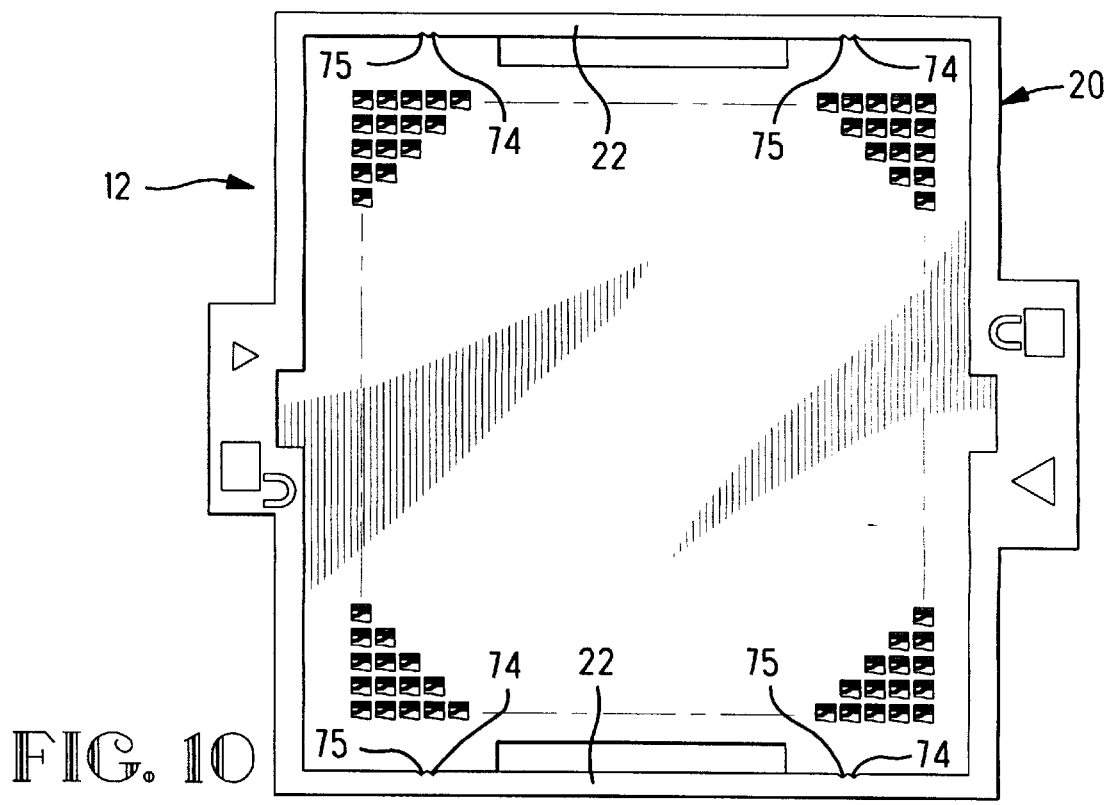
FIG. 10 is a top view of the base shown in FIG. 3 and FIG. 8.

Referring to FIGS. 1, 3 and 10, a retention system is shown which allows the inner frame to be retained in either the open position or the closed position. This is accomplished by the provision of protrusions 44 disposed on the outer surface of inner sidewalls 32 and sets of complimentary detents 74 and 75 disposed on the inner surface of sidewalls 22 of outer frame 20. In the present embodiment, protrusions 44 and detents 74 are arranged such that protrusions 44 are received within one set of detents 74 when the inner frame is shifted into the open position, and received in the other set of detents 75 when the inner frame is shifted into the closed position. As a result, the inner frame may be retained in an open state so that safe insertion of the electronic package is insured by the alignment of holes 37 with pin reception areas 17 of cavity 16. Upon insertion of the electronic package, the inner frame may be shifted into the closed position where protrusions 44 are disengaged from complimentary detents 74 and engaged with detents 75. Pins 52 of electronic package 50 are shifted into engagement with contact arms 62 disposed within contact areas 18 of cavity 16.

Figure 11:
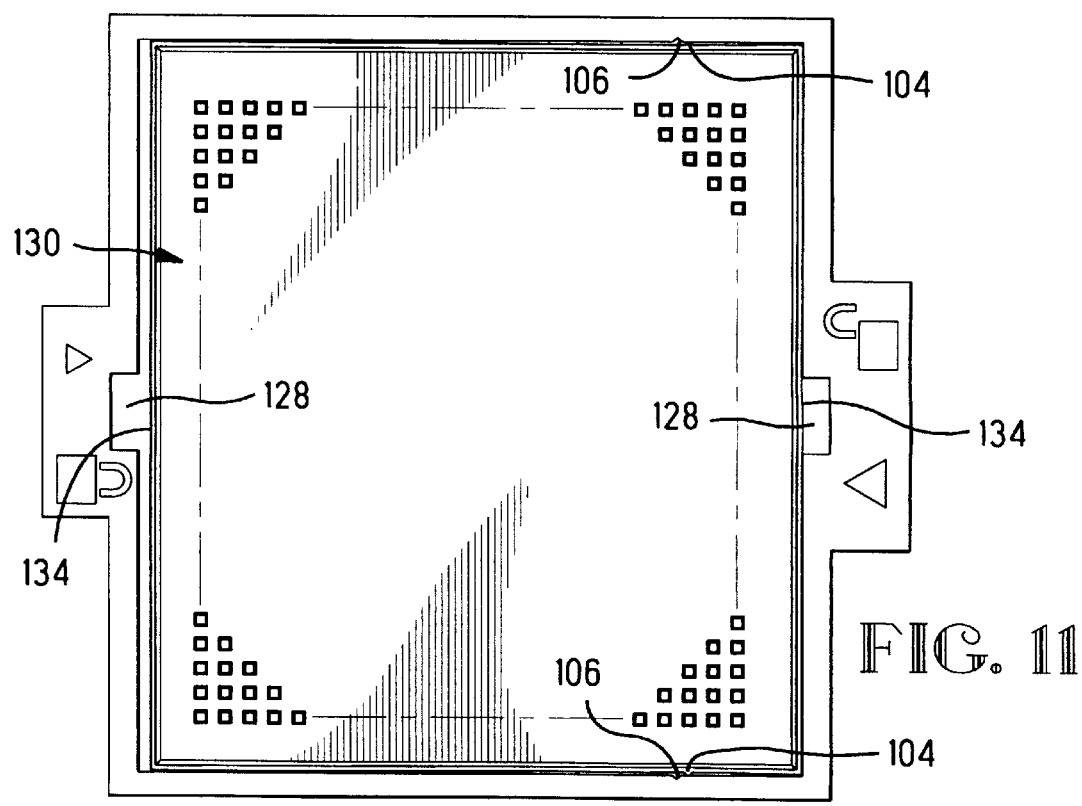
FIG. 11 is a top view of an alternative embodiment of the socket of the present invention.

In an alternative embodiment shown in FIG. 11, only one pair of protrusions 104 and one pair of detents 106 are provided on the inner frame and base, respectively. These protrusions and detents align with one another only when the inner frame is in the open position. When in the closed position, the protrusions and detents are not engaged. Positive retention like that provided in the open position is not absolutely required due to the strong spring force exerted collectively upon the pins by contact arms 62. This spring force is sufficient to retain the electronic package and inner frame in the closed position. Therefore, only by inserting a screwdriver, or similarly bladed tool, into tool receiving recess 128 and urging the blade against an outer surface of inner end wall 134 of the inner frame 130, may the electronic package and inner frame be shifted back into the open position to allow removal of the electronic package from socket 100.

Figure 12:
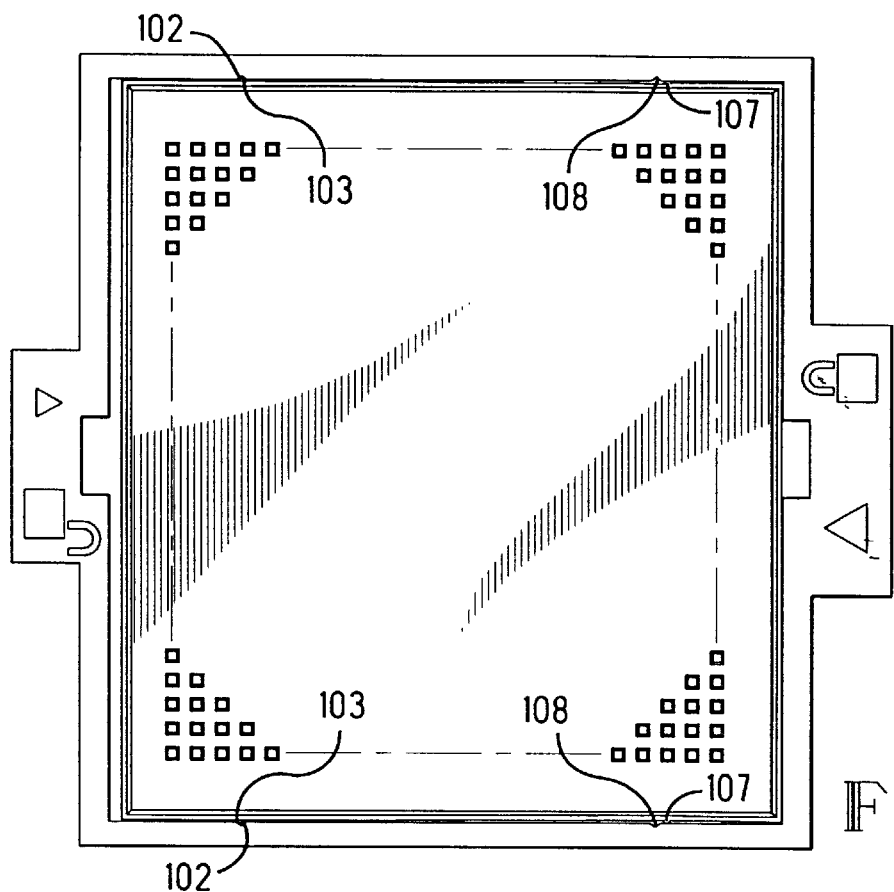
FIG. 12 is a top view of a second alternative embodiment of the socket of the present invention.

Of course, similar retention arrangements may be employed such as using one set of protrusions 102 and detents 103 for retention in the open position and a separate set of protrusions 107 and detents 108 for retention in the closed position, as shown in FIG. 12. In addition, protrusions and detents on the inner frame and outer frame, respectively, may be reversed such that the protrusions are situated on the outer frame and detents are located on the inner frame. In the same spirit, detents and complimentary protrusions may be disposed on the top side of the base and the under side of the floor of the inner frame.

Figure 13:
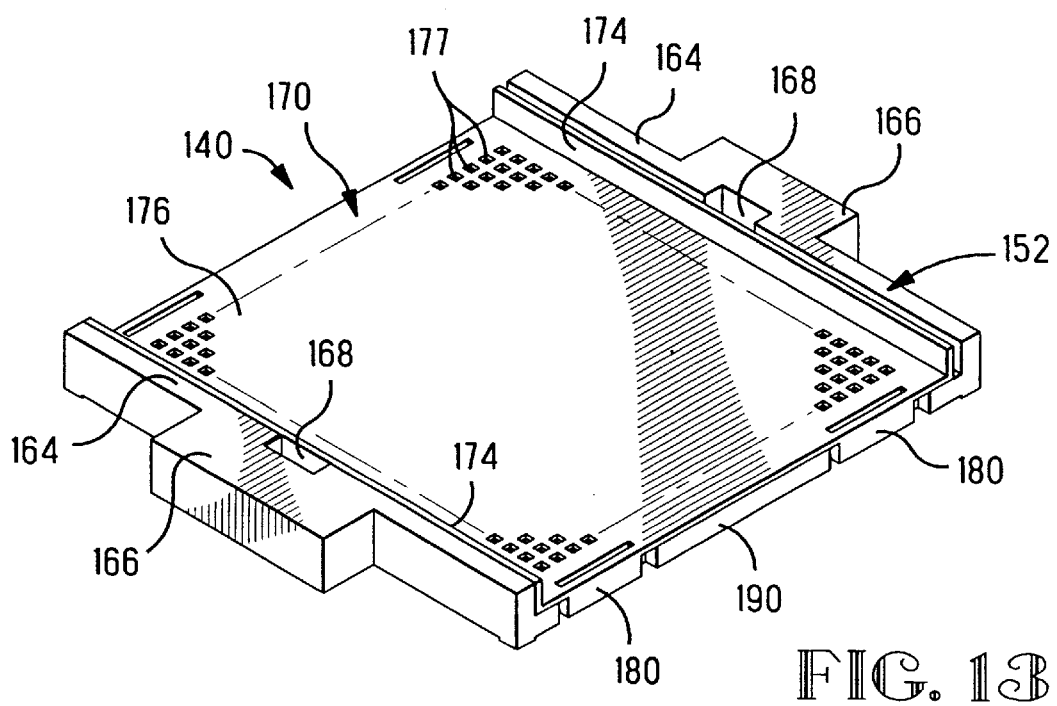
FIG. 13 is another alternative embodiment of the socket of the present invention.

In addition to various retention schemes, numerous inner and outer frame designs may be employed to better meet size constraints and to simplify manufacturing in order to recognize cost benefits. One such design is shown in FIG. 13. In FIG. 13, socket 140 is shown with base 152 having end walls 164 with reinforced portions 166 and tool receiving recesses 168. Inner frame 170 is shown having a floor 176 with an array of holes 177 spanning between inner end walls 174. Side walls 22 and inner side walls 32, as shown in FIG. 1, have been removed. Inner frame 170 may slide from an open position to a closed position by way of guide rails 180 which cooperate with an edge 190 of the base 152, similar to the rail 40 and shoulder 70 configuration of FIGS. 7 and 8.

Although the design of FIG. 13 does not provide as much relative alignment of the electronic package within the socket as the embodiments shown in previous figures, inner end walls 174 still provide some alignment benefits, while providing equal protection of the electronic package from the screwdriver and adequate protection of the electronic package from incidental contact. In addition, the socket 140 may be made smaller, lighter and with less material, thereby meeting more stringent size constraints and being manufacturable at a lower cost.

The ZIF socket of the present invention and many of its attendant advantages will be understood from the foregoing description. It is apparent that changes may be made in the form, construction, and arrangement of parts thereof without departing from the spirit of the invention, or sacrificing all of its material advantages. Thus, while several embodiments of the invention have been disclosed, it is to be understood that the invention is not strictly limited to those embodiments but may be otherwise variously embodied and practiced within the scope of the following appended claims.

I claim:

1. A socket for receiving an electronic package having an array of pins, the socket comprising:
    a base having an array of cavities, each cavity having a pin receiving area and a pin contacting area, the base having a top side with an outer frame disposed thereon surrounding the array of cavities, wherein at least one notch for receiving a tool is provided on the outer frame;
    electrical contacts mounted within the array of cavities; and
    a movable tray for holding the electronic package mounted within the outer frame, the tray having upright edges about a perimeter of an array of holes surrounding the electronic package, at least one of the upright edges being engageable by the tool such that the tray is movable between a first position and a second position wherein the first position provides alignment of each hole with the pin receiving area of a respective cavity and the second position provides alignment of each hole with the pin contacting area of the respective cavity.

2. The socket of claim 1, wherein at least one detent is provided on one of the outer frame or the movable tray and at least one complementary protrusion is disposed on the other of the outer frame or the movable tray such that the at least one detent and the at least one complementary protrusion cooperate to retain the tray in the first position or the second position.

3. The socket of claim 1, wherein at least one rail is disposed on the movable tray for interfitting with at least one complementary shoulder disposed on the outer frame, the at least one rail and the at least one shoulder cooperating to allow the movable tray to slide between the first position or the second position.

4. The socket of claim 3, wherein the at least one rail has a tapered lead-in surface terminated by an edge.

5. The socket of claim 1, wherein the notches are disposed in reinforced areas provided on the outer frame.

6. A socket for receiving an electronic package with an array of pins, the socket comprising:
    a base having a top and a bottom with an array of cavities communicating therebetween, each cavity having a pin receiving region and a pin contacting region, the top of the base having an outer frame around a perimeter of the array of cavities;
    electrical contacts disposed in the array of cavities; and
    a movable inner frame mounted within the outer frame for holding the electronic package, the inner frame having opposing pairs of upright edges along sides of the electronic package, the upright edges spanned by a floor having an array of holes, the inner frame being laterally movable by a tool which engages an outside surface of the upright edges.

7. The socket of claim 6, wherein the floor of the inner frame is constructed of a flexible film.

8. The socket of claim 6, wherein at least one detent is provided on one of the outer frame or the inner frame and at least one complementary protrusion is disposed on the other of the outer frame or inner frame such that the at least one detent and the at least one protrusion cooperate to retain the inner frame in one of the first position or the second position.

9. The socket of claim 8, wherein two detents, a first detent and a second detent, are provided on one of the outer frame or the inner frame to cooperate with the at least one complementary protrusion disposed on the other of the outer frame or inner frame, such that when the inner frame is in the first position, the at least one complementary protrusion is engaged with the first detent, and when the inner frame is in the second position, the at least one complementary protrusion is engaged with the second detent.

10. The socket of claim 6, wherein at least one rail is disposed on the inner frame for interfitting with at least one complementary shoulder disposed on the outer frame, the at least one rail and the at least one shoulder cooperating to allow the inner frame to slide between the first position or the second position.

11. The socket of claim 10, wherein the at least one rail has a tapered lead-in surface terminated by an edge.

12. A socket for receiving an electronic package having an array of pins, the socket comprising:
    a base having an array of cavities, the base having a top side with at least one upright wall disposed thereon adjacent the array of cavities, the at least one upright wall having a recess for receiving a tool on a side nearest the array of cavities;
    electrical contacts mounted within the array of cavities; and
    a movable tray mounted on the top side of the base for holding the electronic package, the tray having an array of holes and at least one upright edge disposed between a side of the electronic package and the at least one upright wall, the movable tray being laterally movable by urging the tool against the at least one upright edge, thereby moving the movable tray between a first position and a second position wherein the first position provides alignment of each hole with a pin receiving region of a respective cavity and the second position provides alignment of each hole with a pin contacting region of the respective cavity.

13. The socket of claim 12, wherein the at least one upright walls is comprised of two opposing upright walls disposed on the top side of the base and the at least one upright edge is comprised of two opposing upright edges which are disposed on the movable tray adjacent the upright walls.

14. The socket of claim 12, wherein guide rails are disposed on one of the movable tray or the base and complementary shoulders are disposed on the other of the movable tray or the base, such that the guide rails and the complementary shoulders cooperate to allow the movable tray to slide between the first position and the second position.

15. The socket of claim 14, wherein the guide rails and the complementary shoulders are disposed along sides of one of the movable tray or the base, the sides running perpendicular to and between the upright edges.

16. A socket for receiving an electronic package having an array of pins, the socket comprising:
 a base having an array of contacts disposed in cavities, the cavities having pin receiving openings;
 an outer frame formed on the base, surrounding the pin receiving openings;
 an inner frame mounted within the outer frame for holding the electronic package, the inner frame having walls surrounding an array of holes and along sides of the electronic package, the inner frame being movable between a first position and a second position via a tool engageable against at least one of the walls, such that when the inner frame is in the first position, the pins are receivable in the pin receiving openings, and when the inner frame is in the second position, the pins make electrical connection with the contacts.

17. The socket of claim 16, wherein the outer frame has a first tool receiving recess which receives the tool adjacent the inner frame.

18. The socket of claim 17, wherein the outer frame has a second tool receiving recess disposed opposite the first tool receiving recess and adjacent the inneer frame.

19. The socket of claim 6, wherein the inner frame is laterally moveable between a first position wherein each hole is aligned with the pin receiving region of a respective cavity and a second position wherin each hole is aligned with the pin connecting region of the respective cavity.

* * * * *